United States Patent
Kubena et al.

(10) Patent No.: US 11,156,897 B2
(45) Date of Patent: Oct. 26, 2021

(54) ENHANCED STABILITY OSCILLATORS USING A PHONONIC COMB

(71) Applicant: HRL Laboratories, LLC, Malibu, CA (US)

(72) Inventors: Randall L. Kubena, Oak Park, CA (US); Walter S. Wall, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/932,455

(22) Filed: Jul. 17, 2020

(65) Prior Publication Data

US 2021/0091748 A1   Mar. 25, 2021

Related U.S. Application Data (60) Provisional application No. 62/904,052, filed on Sep. 23, 2019.

(51) Int. Cl.
  *G02F 1/35* (2006.01)
  *H03H 9/19* (2006.01)

(52) U.S. Cl.
  CPC .......... *G02F 1/353* (2013.01); *G02F 2203/56* (2013.01); *H03H 9/19* (2013.01)

(58) Field of Classification Search
  CPC ........ G02F 1/353; G02F 2203/56; H03H 9/19
  See application file for complete search history.

(56) References Cited

U.S. PATENT DOCUMENTS

| | | | | |
|---|---|---|---|---|
| 4,132,964 A | * | 1/1979 | Wilcox | H03B 5/366 331/116 R |
| 7,750,535 B2 | | 7/2010 | Kubena | |
| 7,851,971 B2 | | 12/2010 | Chang | |

(Continued)

FOREIGN PATENT DOCUMENTS

| KR | 10-2008-0044977 A | 5/2008 |
|---|---|---|
| KR | 10-2012-0132987 A | 12/2012 |

(Continued)

OTHER PUBLICATIONS

Askari, S. et al., "Near-Navigation Grade Quad Mass Gyroscope With Q-Factor Limited by Thermo-Elastic Damping," Solid-State, Actuators, and Microsystems Workshop Technical Digest, Hilton Head, South Carolina, USA, 2016, pp. 254-257.

(Continued)

*Primary Examiner* — Daniel Petkovsek
(74) *Attorney, Agent, or Firm* — Ladas & Parry (57) ABSTRACT

A method and apparatus for enhancing the stability of an oscillator circuit by generating a comb of frequencies in a non-linear resonator member in response to a drive frequency, the oscillator circuit including a voltage controlled oscillator which is locked to a particular tooth of the comb of frequencies produced by the non-linear resonator member at a drive frequency for which the absolute value of the first derivative of the drive frequency versus said comb frequency is greater than 1, and wherein the second voltage controlled oscillator is coupled with a phase locked loop circuit which controls the locking of the second voltage controlled oscillator to said particular tooth of the comb of frequencies.

18 Claims, 4 Drawing Sheets

(56) References Cited

U.S. PATENT DOCUMENTS

| | | | | |
|---|---|---|---|---|
| 8,601,607 | B2* | 12/2013 | Hagmann | B82Y 35/00 850/29 |
| 8,765,615 | B1 | 7/2014 | Chang | |
| 8,994,465 | B1* | 3/2015 | Kubena | H03B 5/366 331/158 |
| 10,110,198 | B1 | 10/2018 | Kubena | |
| 10,389,392 | B1 | 8/2019 | Kubena | |
| 2010/0321117 | A1 | 12/2010 | Gan | |
| 2018/0157148 | A1 | 6/2018 | Kim | |
| 2019/0250198 | A1 | 8/2019 | Kubena | |
| 2020/0158769 | A1* | 5/2020 | Liu | G01R 29/22 |

FOREIGN PATENT DOCUMENTS

| | | | |
|---|---|---|---|
| WO | 2014-018444 A2 | 1/2014 | |
| WO | WO-2019217668 A1 * | 11/2019 | H03H 9/173 |

OTHER PUBLICATIONS

Bennett, S. P. et. al., "Magnetic Field Response of Doubly Clamped Magnetoelectric Microelectromechanical AlN—FeCo Resonators," Applied Physics Letters 111, 252903 (2017).

Bhatia, A. et al., "Linearization of Phase-Modulated Analog Optical Links using a Four-Wave Mixing Comb Source," Optics Express, DOI: 10.1364/OE 22.030899, Dec. 4, 2014.

Chang, et al., "Nonlinear UHF Quartz MEMS Oscillator with Phase Noise Reduction," 26th IEEE International Conference on MicroElectroMechanical Systems, Taipei, Taiwan, Jan. 20-24, 2013, pp. 781-784.

Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).

Ganesan, A., et al., "Phononic Frequency Combs for Engineering MEMS/NEMS Devices With Tunable Sensitivity," 2019 IEEE (4 pages).

Ganesan, A. et al., "Phononic Frequency Comb via Intrinsic Three-Way Mixing," Physical Review Letters, PRL 118, 033903 (2017), (5 pages).

Hui, Y. et al., High Resolution Magnetometer Based on a High Frequency Magnetoelectric MEMS-CMOS Oscillator, Journal of Micromechanical Systems, vol. 24, No. 1, Feb. 2015, pp. 134-143.

Kominis, et al., "A subfemtotesla multichannel atomic magnetometer," Nature, vol. 422, pp. 596-599 (2003).

Krishnamoorthy, U., et al., "In-plane MEMS-based Nano-g Accelerometer with Sub-wavelength Optical Resonant Sensor," Sensors and Actuators A: Physical, 145-146, Jul.-Aug. 2008, pp. 283-290.

Kubena, et al., "A Fully Integrated Quartz MEMS VHF TCXO," 2017 IEEE Frequency Control Symposium, Besancon, Fr., pp. 68-71, Jul. 2017.

Kubena, R. L., et al. "Phononic Comb Generation in High-Q Quartz Resonators", Applied Physics Letters, 116, 053501 (2020).

Nan, et.al., "Acoustically Actuated Ultra-Compact NEMS Magnetoelectric Antenna," Nature Communications, 8:296, DOI: 10.1038/s41467-017-00343-8 (2017), pp. 1-8.

Sheng, et al., "A Microfabricated Optically-Pumped Magnetic Gradiometer," Applied Physics Letters 110, 031106 (2017).

Veryaskin, A. "Gravity, Magnetic and Electromagnetic Gradiometry: Strategic Technologies in the 21st century", IOP ebooks, 2018 (57 pages).

Vrba, J., "SQUID Sensors: Fundamentals, Fabrication and Applications," edited by H. Weinstock, Kluwer Academic, Dordrecht, The Netherlands, 1996, p. 117.

Wang, S. et al., "A MEMS Resonant Accelerometer for Low-Frequency Vibration Detection," Sensors and Actuators A: Physical, 283, Nov. 2018, pp. 151-158.

WenJie, W. et al., "A Nano-g MEMS Accelerometer for Earthquake Monitoring," 19th Intern. Conf. on Solid-State Sensors, Actuators and Microsystems (Transducers), DOI 10.1109/Transducers 2017, pp. 599-602.

Yao, et. al., "Bulk Acoustic Wave-Mediated Multiferroic Antennas: Architecture and Performance Bound," IEEE Transactions on Antennas and Propagation, vol. 63, No. 8, Aug. 2015.

Zhai, J.., et. al., "Detection of Pico-Tesla Magnetic Fields using Magneto-Electric Sensors at Room Temperature," Applied Physics Letters, 88, 062510 (2006).

PCT International Search Report and Written Opinion from PCT/US2020/051863 dated Jan. 4, 2021.

* cited by examiner

ENHANCED STABILITY OSCILLATORS USING A PHONONIC COMB

CROSS REFERENCE TO RELATED APPLICATIONS

This application claims the benefit of U.S. Provisional Patent Application Ser. No. 62/904,052, filed 23 Sep. 2019 and entitled: "Enhanced Stability Oscillators using a Phononic Comb", the disclosure of which is hereby incorporated herein by reference.

This application is related to the technology disclosed in U.S. Provisional Patent Application Ser. No. 62/881,069, filed 31 Jul. 2019 and entitled "Phononic Comb Enhanced Gradiometers" and its corresponding non-Provisional U.S. patent application Ser. No. 16/932,431, having the same title as its related provisional application and filed on the same date as this application, the disclosures of which are hereby incorporated herein by reference.

This application is related to the technology disclosed in U.S. Provisional Patent Application Ser. No. 62/890,799, filed 23 Aug. 2019 and entitled "Phononic Comb Enhanced MEMS Gravity Gradiometers" and its corresponding non-Provisional U.S. patent application Ser. No. 16/932,447, having the same title as its related provisional application and filed on the same date as this application, the disclosures of which are hereby incorporated herein by reference.

STATEMENT REGARDING FEDERALLY SPONSORED RESEARCH OR DEVELOPMENT

None.

TECHNICAL FIELD

An apparatus and method for increasing the stability of quartz oscillators.

BACKGROUND

Quartz oscillators was used in many applications in today's electronics. Low phase noise is required for many applications of quartz oscillators including radar, navigation, and communication applications. There has a continuous need to improve the phase noise and reduce the Size, Weight and Power (SWaP) of reference oscillators. Nonlinear effects such as Duffing effects in MEMS resonators has been explored in the past to improve phase noise.

Temperature Compensated Crystal Oscillators (TCXOs) are used in many clock applications and have a small size and low power (typically around 15 mm$^3$ and <10 mW, respectively). However, they can drift about 0.2 ppm over temperature and have typical phase noise of −90 dBc/Hz @10 Hz. Low cost TCXOs have g-sensitivities of $1 \times 10^{-9}$/g, and g-hardened TCXOs can have g-sensitivities of ~2-5× $10^{-11}$/g. To achieve higher stability, Oven Controlled Crystal Oscillators (OCXOs) are used. Miniaturized OCXOs typically have larger volumes of about 1000 mm$^3$ and use >150 mW of power. They provide temperature stability of <50 ppb and phase noise of around −120 dBc/Hz @10 Hz. However, OCXOs can have higher g-sensitivity than g-hardened TCXOs. To further improve the temperature stability and phase noise at lower offset frequencies, Chip-Scale Atomic Clocks (CSAC) have been developed. However, their size and power are even larger than OCXOs by roughly an order of magnitude and their g-sensitivity can be orders of magnitude worse than a TCXO. Thus, there is a need for a true chip-scale clock with TCXO-like power requirement, but higher stability than a TCXO, and g-sensitivities in the $10^{-11}$/g range.

As mentioned above, nonlinear Duffing effects have be used in the past for attempting to improve the phase noise of low cost MEMS oscillators, including those made from quartz, AlN, and silicon. See, for example, D. T. Chang, H. P. Moyer, R. G. Nagele, R. L. Kubena, R. J. Joyce, D. J. Kirby, P. D. Brewer, H. D. Nguyen, and F. P. Stratton, "Nonlinear UHF Quartz MEMS Oscillator with Phase Noise Reduction," 26th IEEE International Conference on Micro-ElectroMechanical Systems, Taipei, Taiwan, Jan. 20-24, 2013. However, none of these previous attempts have been completely successful due in part to the need to operate at or near the bifurcation point where the dependence of the frequency on the drive level is large. Thus, Amplitude Modulation (AM) noise in the sustaining circuit can be converted to Phase Modulation (PM) noise in the output. This disclosure describes a technique and structure which, when driven below the strong nonlinear Duffing condition (prior to the onsite of bifurcation and/or less than roughly several hundred ppm drive-level induced shifts), provides for frequency insensitivity to noise on the drive amplitude and PM noise reduction of the driving oscillator. These capabilities have only recently become evident by the discovery of high-Q phononic combs in quartz AT-cut resonators and by other measurements made at the Univ. of Cambridge for AlN resonators (see A. Ganesan, et al., "Phononic Frequency Comb via Intrinsic Three-Way Mixing," Phy. Rev. Lett., PRL 118, 033903 (2017), pp. 1-5). The inventors have made the first measurements of quartz phononic combs over a range of drive frequencies and have discovered that for certain modal interactions, powers, and frequencies, the output frequencies of particular comb teeth can be insensitive to the drive frequency. Based on these features, a new clock topology has been conceived which reduces the phase noise of the clock.

Phononic combs form when one or more high-Q resonances are driven slightly off their resonant frequency into a nonlinear state. The inventors of the present invention demonstrate that phononic combs can be created in high Q quartz resonators. Teeth in these combs exhibit complex behavior relative to the drive frequency and can be used to enhance or suppress frequency shifts in the system.

SUMMARY OF THE INVENTION

This disclosure describes a method of using a phononic frequency comb to enhance the stability of an oscillator.

When a phononic comb is produced through modal mixing of local modes within the resonator which is driven slightly off one of its resonant frequencies, the comb teeth can exhibit regions of low drive frequency sensitivity. This effect can be utilized to provide a high stability reference for locking a second voltage-controlled crystal oscillator (VCXO). Thus, the output of a second VCXO can be stabilized compared to its own native stability. This can be done with only a modest increase in size and power compared to a single VCXO since MEMS-based VCXOs can be integrated in arrays on a single Si wafer with each resonator only requiring <1 mm$^2$ of space. In addition, the drive and reference element can be ovenized to increase the stability over temperature or modes can be used which are temperature compensated. In the case of resonant mode sensors (such as temperature, pressure, and acceleration sensors), the more sensitive teeth in the comb can be used to enhance frequency shifts induced by input stimuli. In the case of oscillators for timing, stable comb teeth can be used to reduce noise.

In one aspect the presently disclosed technology provides an oscillator comprising: a first voltage controlled oscillator, a nonlinear resonator element, a second voltage controlled oscillator, and a Phase Locked Loop (PLL) circuit; wherein the first voltage controlled oscillator comprises at least a first resonator and its sustaining circuit, wherein the first oscillator drives the nonlinear resonator element producing a frequency comb, wherein the second voltage controlled oscillator is locked, in use, to a selected tooth of the comb at a frequency in which the first derivative of the drive frequency versus the frequency of the selected tooth in the comb has an absolute value greater than 1, and wherein the PLL circuit controls the locking of the second voltage controlled oscillator to the frequency of the selected tooth.

In another aspect the presently disclosed technology provides an oscillator comprising: a plurality of piezoelectric resonators; first and second sustaining circuits coupled to first and second ones of the plurality of piezoelectric resonators, wherein the first of the sustaining circuits generates a drive signal of given frequency that is applied to another one of said plurality of piezoelectric resonators which generates a frequency comb signal; wherein the second of the sustaining circuits is coupled with a phase locked loop system, the second one of the resonators being locked to a selected tooth of the frequency comb signal at a particular frequency for which a first derivative of the drive frequency signal versus the frequency of the selected tooth has an absolute value greater than one; and wherein the PLL system controls the locking of the second oscillator to the selected tooth of the comb wherein said first derivative has an absolute value greater than one.

In yet another aspect the presently disclosed technology provides a method for enhancing the stability of an oscillator circuit by generating a comb of frequencies in a non-linear resonator member in response to a drive frequency, the oscillator circuit including a voltage controlled oscillator which is locked to a particular or selected tooth of the comb of frequencies produced by the non-linear resonator member at a drive frequency for which an absolute value of the first derivative of the drive frequency versus said frequency of a particular tooth of the comb is greater than 1, the voltage controlled oscillator being coupled with a PLL circuit for controlling the locking of the voltage controlled oscillator to said particular or selected tooth of the comb of frequencies.

In still yet another aspect the presently disclosed technology provides an oscillator circuit, the oscillator circuit generating a drive signal, the oscillator circuit including a non-linear resonator member which generates, in use, a comb of frequencies in response to said drive signal, the oscillator circuit including a voltage controlled oscillator and a PLL, the voltage controlled oscillator being locked by the PLL to a particular or selected tooth of the comb of frequencies produced by the non-linear resonator member at a drive signal frequency for which an absolute value of the first derivative of the drive frequency versus said frequency of a particular tooth of the comb is greater than one.

An apparatus and method for increasing the stability of a quartz oscillator by generating a phononic comb in a non-linear quartz resonator and selecting a tooth in said comb for which a first derivative of the drive frequency versus the frequency of the selected tooth in a comb has an absolute value greater than one to thereby reduce frequency instability of the quartz oscillator.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

An apparatus and method is disclosed herein for increasing the stability of quartz oscillators by using a phononic comb generated in a nonlinear resonator, preferably embodied by a quartz MEMS electro-mechanical resonator, to reduce the frequency instability. A frequency comb has been shown to exhibit regions in which the frequency of particular teeth are insensitive (or substantially insensitive) to changes in the difference between a drive frequency (from a crystal oscillator—the "drive oscillator" also preferably embodied by another quartz MEMS electro-mechanical resonator) and the resonator modal frequency of the nonlinear resonator. By using these teeth frequencies as references in a phase-locked loop (PLL), a voltage-controlled crystal oscillator (VCXO) can be stabilized to these reference frequencies of the comb.

Low phase noise is required for many applications including radar, navigation, and communication. There is a constant need to improve the phase noise and reduce the SWaP of reference oscillators. Nonlinear effects such as Duffing in MEMS resonators has been explored in the past to improve phase noise. This disclosure describes a related but different effect that can occur in resonators when they are driven nonlinearly. When a phononic comb is produced through modal mixing of local modes within the resonator which is driven slightly off one of its resonant frequencies, the comb teeth can exhibit regions of low drive frequency sensitivity. These regions of low drive frequency sensitivity can exist on either the right or left side of the drive frequency (higher or lower frequency than the drive frequency). This effect can be utilized to provide a high stability reference for locking a second VCXO. Thus, the output of the second VCXO can be stabilized compared to its own native stability. This can be done with only a modest increase in size and power compared to a single VCXO since MEMS-based VCXOs can be integrated in arrays on a single Si wafer with each resonator only requiring <1 mm$^2$.

An embodiment of the disclosed technology is now described with reference to FIG. 1 with supporting data of a quartz AT-cut resonator frequency comb shown in FIGS. 2, 3 and 4.

Figure 1:
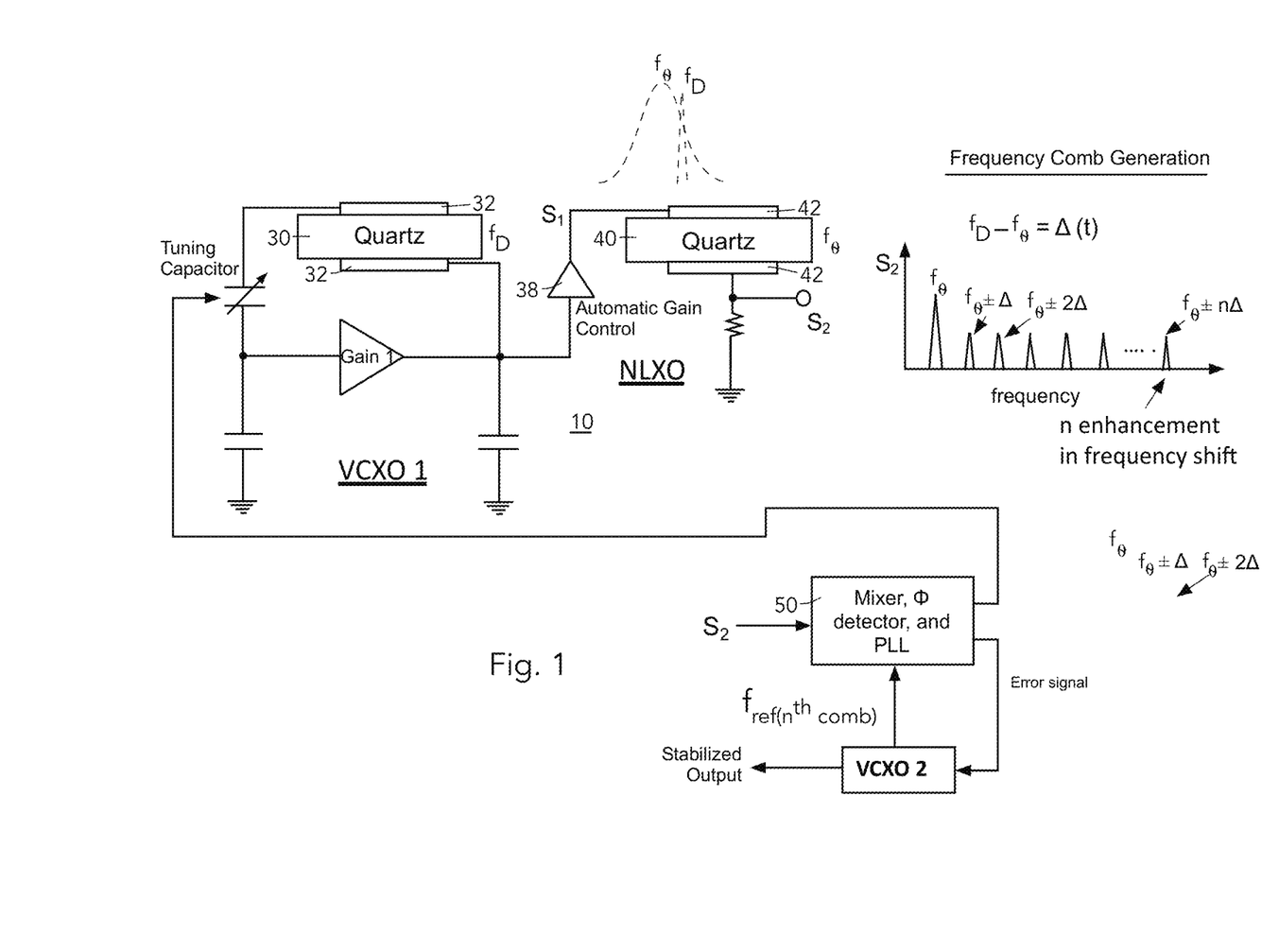
FIG. 1 is a schematic drawing of phononic frequency comb enhanced VCXO (2) with a drive VCXO (1) which includes a quartz resonator driven off-resonance to produce the comb and a reference VCXO (2) which is stabilized using the $n^{th}$ tooth of the comb at a point with its slope (defined as the first derivative of the drive frequency versus the tooth output) >1. The comb tuning signal is used to position the drive frequency at this point.

FIG. 1 shows the basic components of embodiment of the present invention as a first VCXO (VCXO1) comprising two resonators 30 and 40, a second VCXO (VCXO2) acting as the sensor or oscillator and electronics comprising a mixer, a phase detector, and a PLL circuit. A drive signal generated by a first VCXO (VCXO1) is preferably amplified and stabilized with an automatic gain control circuit 38. The output $S_1$ at frequency $f_D$ is applied to resonator 40 having a resonant mode at a frequency $f_\Theta$. With appropriate modal coupling within resonator 40 and at drive levels below the nonlinear Duffing bifurcation condition (for which $f_\Theta$ is strongly dependent on the amplitude of $S_1$), a frequency comb, $S_2$, is generated as shown in FIG. 2 and graphically, over a range of drive frequencies, in FIG. 3. The nonlinear response in the preferably quartz material of the resonator is evidenced by the generation of a frequency comb at $f_\Theta$, $f_\Theta \pm \Delta$, $f_\Theta \pm 2\Delta$, $f_\Theta \pm 3\Delta$ ... $f_\Theta \pm n\Delta$, where $\Delta = f_D - f_\Theta$. When so driven, resonator 40 may be characterized as a non-linear resonator element which forms a non-linear resonator oscillator (NLXO).

Figure 3:
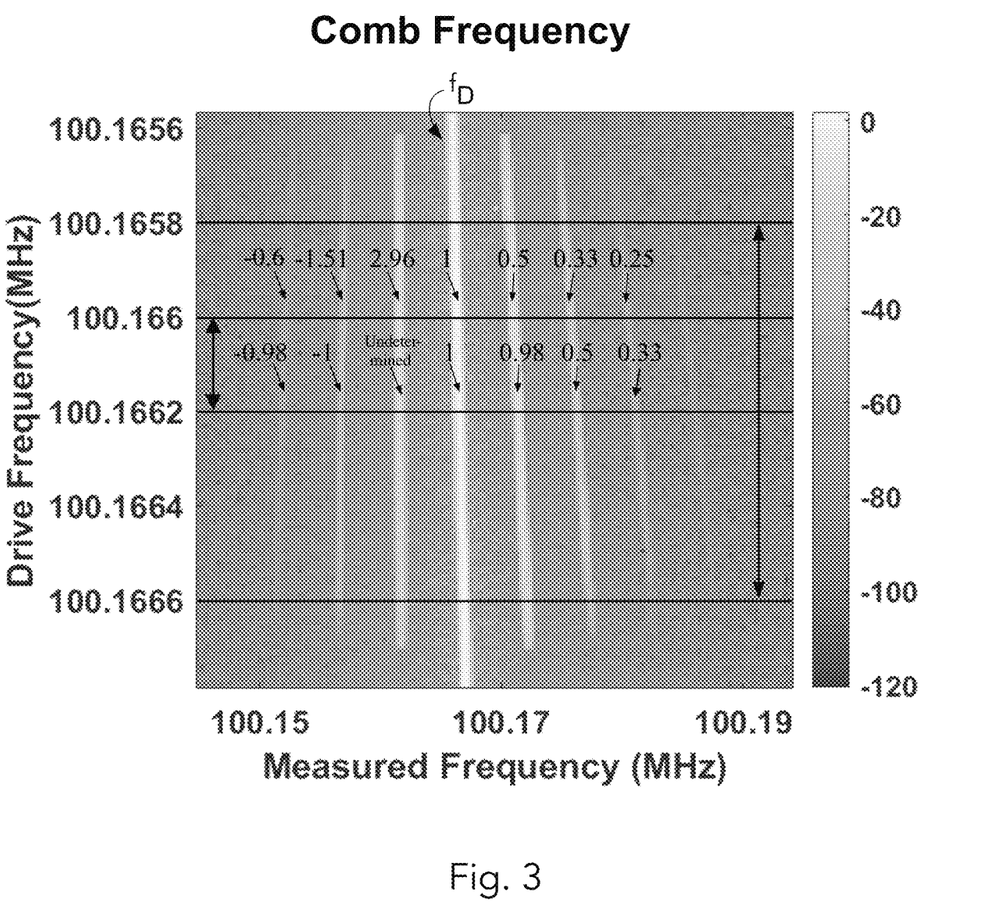
FIG. 3 depicts the comb output frequencies versus the drive frequency for the 100 MHz resonator described with respect to FIG. 2. The slopes (the first derivative) of the drive frequency versus the frequency of a tooth of the comb are marked on this figure over two regions of drive frequency.

It has been observed, as shown in FIG. 3, that for particular teeth of the comb (see the left hand side of the comb of FIG. 3) and for a range of drive frequencies, the output frequencies of a tooth can be independent (or substantially independent) of the drive frequency as evidenced by large slopes (or substantially large slopes) of the plots of the drive frequencies versus the comb output frequencies. A "large" slope, as that term is used herein, is characterized by a nearly vertical representation of a tooth frequency on FIG. 3. While an infinite slope might be ideal in order for the output frequencies of the teeth to be independent (or substantially independent) of the drive frequency, a slope greater than 1 is an improvement in terms of making the output frequency of a selected tooth less dependent on the drive frequency $f_D$ than just using the drive frequency $f_D$ as a clock.

In most oscillators, the far-out phase noise is determined by the electronic noise in the sustaining circuit. This noise will not be present on the modes of resonator not used within a sustaining; thus, by locking a second VCXO (VCXO2) to a selected one (an $n^{th}$ tooth) of these teeth within a PLL and using the error signal of the PLL to correct for relative changes in frequency between VCXO (VCXO2) and $S_2$, the output frequency of second VCXO (VCXO2) can be stabilized to a level provided by the $n^{th}$ tooth of the comb. Using a feedback tuning signal to the varactor in VCXO (1), one can tune the frequency of the drive signal S1 to the highest slope and lowest noise condition. For ease of illustration, only the higher frequency teeth are specifically shown in FIG. 1 while teeth on either side of the drive frequency are identified on FIG. 3, it being understood that the comb typically appears on both sides of the drive frequency $f_D$ at frequencies shown on FIG. 2.

For the frequency drive frequency vs comb frequency response of resonator 40 shown by FIG. 3, the output frequency of second VCXO (VCXO2) might well be stabilized to a level provided by the first tooth to the left of the frequency of the drive oscillator ($f_D$) at a frequency in the range of 100.1658-100.1666 MHz because the slope (its first derivative) of the drive frequency vs. the comb frequency of this tooth in that range is 2.96. The slope is even steeper (closer to infinite) when the drive oscillator ($f_D$) is in a frequency in the range of 100.1660-100.1662 MHz Ideally, the slope (its first derivative) of the drive frequency vs. the comb frequency should be as large as possible (and the slope is infinite when the comb frequency response depicted by FIG. 3 is exactly vertical). The "Undetermined" region is due to the fact that the slope was too large to make a slope calculation with the equipment used for these measurements.

The slope of the drive frequency $f_D$ is not surprisingly equal to +1. It is angled slightly to the left in FIG. 3. As the slopes of the teeth get closer to absolutely vertical (moving in a clock-wise direction on FIG. 3 from $f_D$) they approach an infinite slope (where the tooth frequency is desirously independent of the drive frequency). As the slope of the teeth move past vertical (again rotating in a clock-wise direction), the slope values become negative. So long as the slope of a selected tooth has an absolute value greater than one, it is has a desirable lower dependency on the drive frequency $f_D$. If the slope of a selected tooth increases still further, that results in a further improvement in terms of being insensitive to the drive frequency.

The reader will note that the scales of the Drive Frequency is very narrow compared to the scale of the Measured Comb Frequency of FIG. 3, so a slope of 1 (of $f_D$) is close to, but not quite, vertical in this graph. On either side of a vertical (or large) slope in FIG. 3, the slopes of the teeth can have either positive or negative values. Since ideally the absolute value of the first derivative of the drive frequency versus the frequency of a tooth in the comb should have value greater than 1 (and preferably much greater than 1 and, even more preferably, infinite), operating the clock of FIG. 1 utilizing a NLXO generating a tooth having a slope of either 2.96 or a slope marked "Undetermined" (for the depicted drive frequencies $f_D$) would be the preferred option for a NLXO producing a comb as shown in FIG. 3. A reduction in the sensitivity of particular comb teeth to the drive frequency $f_D$ variations is attained if the first derivative of the drive frequency versus the frequency of a selected tooth of the comb has an absolute value greater than 1.

In FIG. 3 the slopes listed in the upper row for the various teeth were measured of a range corresponding to the longer arrow, while the slopes listed in the lower row for the various teeth were measured of a range corresponding to the shorter arrow.

Figure 4:
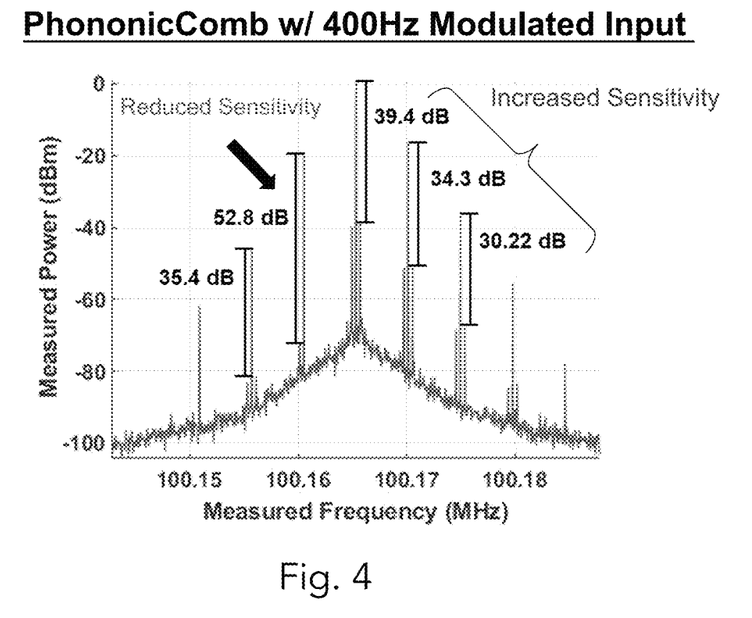
FIG. 4 depicts the comb in FIG. 2 but with a 400 Hz FM modulation of the drive frequency applied. The sidebands around each tooth represent the transfer of this modulation on each tooth. The tooth to the left of the drive frequency shows a suppression of the relative amplitude of the modulation to the peak amplitude of that tooth.

This reduction in the sensitivity of particular comb teeth to the drive frequency variations is also shown in FIG. 4 where a 400 Hz FM modulation is added to the drive frequency. The increase in the signal-to-noise (S/N) ratio for the first tooth to the left of the drive frequency shows that this comb tooth can reduce noise on the drive signal.

The inventors of the presently disclosed technology have observed that the high frequency jitter of first VCXO (VCXO1) can be substantially reduced using this technique. Since a large portion of the phase noise of an oscillator is due to noise within the sustaining circuit (VCXO1 the embodiment of FIG. 1), this noise will not be present in resonator 40. Thus, the large slope region (left side of the comb in FIG. 3) of a comb will tend to filter out the electronic noise.

The above design can be implemented in a quartz MEMS process in which VCXO (1), resonator (1), resonator (2), and VCXO (2) are all integrated with the PLL on a common semiconductor (Si, for example) substrate using quartz piezoelectric resonators. This will provide a chip-scale oscillator with dimensions of roughly ≤20 mm$^3$ (a single quartz MEMS TCXO has been demonstrated with dimensions of 2×3 mm$^2$, see R. L. Kubena, et al., "A Fully Integrated Quartz MEMS VHF TCXO," 2017 IEEE Frequency Control Symposium, Besancon, Fr., pp. 68-71, July 2017, which is hereby incorporated by reference). In addition, the components can be ovenized for additional stability over temperature leading to a comb-enhanced OCXO. Finally, although quartz resonators have demonstrated high-Q combs with these unique features, other MEMS resonators formed of materials such as Si or AlN could be utilized instead so as long as they demonstrate the desired nonlinear and modal coupling effects.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

Figure 2:
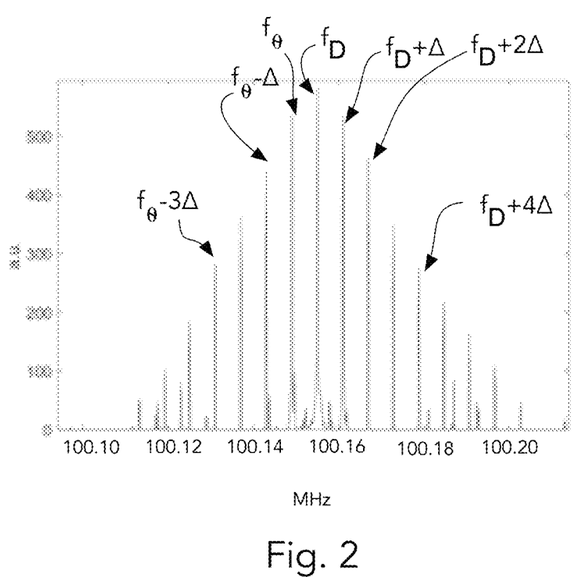
FIG. 2 is a graph depicting the amplitudes of the combs of a phononic frequency comb produced when a 100-MHz AT-cut resonator is driven off-resonance by roughly 5 kHz from its first anharmonic mode at a drive level of 15 dBm.

The figures accompanying this application are presented as black and white drawings, but colored versions of FIGS. 2-4 can be found in Appendix A to this patent application. The colored version of those figures present certain data somewhat more clearly than do the black and white versions thereof so those interested in the present technology may wish to request a color copy of Appendix A from the United States Patent and Trademark Office.

The generation of high fidelity phononic frequency combs in quartz resonators was demonstrated at HRL Laboratories, LLC of Malibu, Calif. in 2019, the results of which are reported in a paper entitled "Phononic Comb Generation in High-Q Quartz Resonators", R. L. Kubena, et al., Appl. Phys. Lett. 116, 053501 (2020) which is attached hereto as Appendix B. Appendix B is incorporated herein by this reference thereto.

What is claimed is:

1. An oscillator comprising:
   a first voltage controlled oscillator, a nonlinear resonator element, a second voltage controlled oscillator, and a phase locked loop (PLL) circuit;
   wherein the first voltage controlled oscillator comprises at least a first resonator and a sustaining circuit in electrical communication with the first resonator, the first voltage controlled oscillator producing a drive signal having a drive frequency,
   wherein the first voltage controlled oscillator drives the nonlinear resonator element to produce, in use, a frequency comb,
   wherein the second voltage controlled oscillator is locked, in use, to a selected tooth of the comb at a frequency in which a first derivative of the drive frequency with respect to the frequency of the selected tooth in the comb has an absolute value greater than 1, and
   wherein the phase locked loop circuit controls the locking of the second voltage controlled oscillator to the frequency of the selected tooth.

2. An oscillator as claimed by claim 1 wherein the first resonator and the non-linear resonator element each include a piezoelectric quartz resonating member.

3. An oscillator as claimed by claim 1 wherein the second voltage controlled oscillator is locked to a particular tooth of the comb at a frequency in which the first derivative of the drive frequency with respect to the frequency of the comb has an absolute value greater than 2.5.

4. An oscillator comprising:
a plurality of piezoelectric resonators;
first and second sustaining circuits coupled to first and second ones of the plurality of piezoelectric resonators, wherein the first of the sustaining circuits generates a drive frequency signal of a given frequency that is applied to another one of said plurality of piezoelectric resonators which generates a frequency comb signal;
wherein the second of the sustaining circuits is coupled with a phase locked loop system, the second one of the plurality of resonators being locked to a selected tooth of the frequency comb signal at a particular frequency for which a first derivative of the drive frequency signal with respect to the frequency of the selected tooth of the frequency comb signal has an absolute value greater than one; and
wherein the phase locked loop system controls the locking of the second oscillator to the selected tooth of the frequency comb signal wherein said first derivative has an absolute value greater than one.

5. An oscillator as claimed by claim 4 wherein the plurality of resonators each include a piezoelectric quartz resonating member.

6. An oscillator as claimed by claim 4 wherein the second one of the plurality of resonators is locked to a particular tooth of the frequency comb signal at a frequency in which the first derivative of the drive frequency with respect to the frequency comb signal has an absolute value greater than 2.5.

7. A method for enhancing the stability of an oscillator circuit by generating a comb of frequencies in a non-linear resonator member in response to a drive frequency, the oscillator circuit including a voltage controlled oscillator which is locked to a particular or selected tooth of the comb of frequencies produced by the non-linear resonator member at a drive frequency for which an absolute value of a first derivative of the drive_frequency with respect to said comb frequency is greater than 1, the voltage controlled oscillator being coupled with a phase locked loop circuit for controlling the locking of the voltage controlled oscillator to said particular or selected tooth of the comb of frequencies.

8. A method as claimed by claim 7 wherein the non-linear resonator member includes a piezoelectric quartz member.

9. A method as claimed by claim 7 wherein the voltage controlled oscillator includes a resonating member comprised of quartz.

10. A method as claimed by claim 7 wherein the voltage controlled oscillator is locked to the particular or selected tooth of the comb at a frequency for which the first derivative of the drive frequency with respect to the comb frequency is greater than 2.5.

11. A method as claimed by claim 7 wherein the voltage controlled oscillator includes a resonator member and wherein both the resonator member included in the voltage controlled oscillator and the non-linear resonator member each includes a piezoelectric quartz member.

12. A method of claim 11 in which both resonator members are ovenized to enhance the stability of the comb with respect to temperature.

13. An oscillator circuit, the oscillator circuit generating a drive signal, the oscillator circuit including a non-linear resonator member which generates, in use, a comb of frequencies in response to said drive signal, the oscillator circuit including a voltage controlled oscillator and a phase locked loop, the voltage controlled oscillator being locked by the phased locked loop to a particular or selected tooth of the comb of frequencies produced by the non-linear resonator member at a drive signal frequency for which an absolute value of a first derivative of the drive frequency with respect to the particular or selected tooth of the comb is greater than one.

14. An oscillator circuit as claimed by claim 13 wherein the non-linear resonator member includes a piezoelectric quartz member.

15. An oscillator circuit as claimed by claim 13 wherein the voltage controlled oscillator is locked to the particular or selected tooth of the comb at a frequency for which the absolute value of the first derivative of the drive frequency with respect to the particular or selected tooth of the comb is greater than 2.5.

16. An oscillator circuit as claimed by claim 13 wherein the voltage controlled oscillator includes a resonator member and wherein the both the resonator member included in the voltage controlled oscillator and the non-linear resonator member each includes a piezoelectric quartz member.

17. An oscillator circuit as claimed by claim 16 in which both resonator members are ovenized to enhance the stability of the comb teeth over temperature.

18. A method for increasing the stability of a quartz oscillator by generating a phononic comb in a nonlinear quartz resonator and selecting a tooth in said comb for which a first derivative of the drive frequency signal versus the frequency of the selected tooth of the comb has an absolute value greater than one to thereby reduce frequency instability of the quartz oscillator.

* * * * *